(12) United States Patent
Ohtani

(10) Patent No.: US 6,888,775 B2
(45) Date of Patent: May 3, 2005

(54) SEMICONDUCTOR MEMORY DEVICE FOR IMPROVEMENT OF DEFECTIVE DATA LINE RELIEF RATE

(75) Inventor: Jun Ohtani, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 147 days.

(21) Appl. No.: 10/454,666

(22) Filed: Jun. 5, 2003

(65) Prior Publication Data

US 2004/0114449 A1 Jun. 17, 2004

(30) Foreign Application Priority Data

Dec. 11, 2002 (JP) .................................... 2002-359419

(51) Int. Cl.$^7$ .............................................. G11C 8/00
(52) U.S. Cl. ............................ 365/230.03; 365/230.06
(58) Field of Search ..................... 365/230.03, 230.06

(56) References Cited

U.S. PATENT DOCUMENTS 4,428,068 A * 1/1984 Baba ........................ 365/200
4,471,472 A * 9/1984 Young ...................... 365/200

FOREIGN PATENT DOCUMENTS

| JP | 2000-100191 | 4/2000 |
|---|---|---|
| JP | 2001-6389 | 1/2001 |
| JP | 2001-256794 | 9/2001 |

* cited by examiner

*Primary Examiner*—M. Tran
(74) *Attorney, Agent, or Firm*—McDermott Will & Emery LLP

(57) ABSTRACT

A semiconductor memory device according to the present invention includes: a data line switching circuit including a plurality of switches which selectively connect one of a plurality of normal data lines and spare data lines included in a memory cell array to one of a plurality of global data lines for transmitting input/output data to the memory cell array; and a switching control circuit including a shift decoder having decode circuits for decoding a defective address stored in a program circuit as many as the switches.

7 Claims, 15 Drawing Sheets

FIG.5

| DATA LINE ADDRESS | SHIFT DECODER INPUT SIGNAL | | | | |
|---|---|---|---|---|---|
| | SK | SL | SM | SN | SO |
| 0 | Z⟨10⟩ | H | Z⟨7⟩ | H | Z⟨0⟩ |
| 1 | | | | | Z⟨1⟩ |
| 2 | | | | | Z⟨2⟩ |
| 3 | | | | | Z⟨3⟩ |
| 4 | | | | | Z⟨4⟩ |
| 5 | | | | | Z⟨5⟩ |
| 6 | | | | | Z⟨6⟩ |
| 7 | | | | | L |
| 8 ∫ 15 | | | Z⟨8⟩ | Z⟨7⟩ | d |
| 16 ∫ 23 | | | Z⟨9⟩ | Z⟨8⟩ | d |
| 24 ∫ 31 | | | L | Z⟨9⟩ | d |
| 32 ∫ 63 | Z⟨11⟩ | Z⟨10⟩ | b | c | e |
| 64 ∫ 95 | Z⟨12⟩ | Z⟨11⟩ | b | c | e |
| 96 ∫ 127 | L | Z⟨12⟩ | b | c | e |

| FUSE PROGRAM ADDRESS | DA⟨n:0⟩ | | | | | | | F1S(n) AND F2S(n) | | | | | | | | |
|---|---|---|---|---|---|---|---|---|---|---|---|---|---|---|---|---|
| | 6 | 5 | 4 | 3 | 2 | 1 | 0 | 0 | 1 | 2 | 3 | 4 | ... | 125 | 126 | 127 |
| 0 | 0 | 0 | 0 | 0 | 0 | 0 | 0 | 1 | 1 | 1 | 1 | 1 | ... | 1 | 1 | 1 |
| 1 | 0 | 0 | 0 | 0 | 0 | 0 | 1 | 0 | 1 | 1 | 1 | 1 | ... | 1 | 1 | 1 |
| 2 | 0 | 0 | 0 | 0 | 0 | 1 | 0 | 0 | 0 | 1 | 1 | 1 | ... | 1 | 1 | 1 |
| 3 | 0 | 0 | 0 | 0 | 0 | 1 | 1 | 0 | 0 | 0 | 1 | 1 | ... | 1 | 1 | 1 |
| 4 | 0 | 0 | 0 | 0 | 1 | 0 | 0 | 0 | 0 | 0 | 0 | 1 | ... | 1 | 1 | 1 |
| ⋮ | ⋮ | ⋮ | ⋮ | ⋮ | ⋮ | ⋮ | ⋮ | ⋮ | ⋮ | ⋮ | ⋮ | ⋮ | | ⋮ | ⋮ | ⋮ |
| 126 | 1 | 1 | 1 | 1 | 1 | 1 | 0 | 0 | 0 | 0 | 0 | 0 | ... | 0 | 1 | 1 |
| 127 | 1 | 1 | 1 | 1 | 1 | 1 | 1 | 0 | 0 | 0 | 0 | 0 | ... | 0 | 0 | 1 |

| GIOn | 0 | 1 | 2 | 3 | 4 | 5 | 6 | ... | 125 | 126 | 127 |
|---|---|---|---|---|---|---|---|---|---|---|---|
| F1S(n) | 0 | 0 | 1 | 1 | 1 | 1 | 1 | ... | 1 | 1 | 1 |
| F2S(n) 0 | | 0 | 0 | 0 | 1 | 1 | 1 | ... | 1 | 1 | 1 |
| SHIFT COUNT | 0 | 0 | 1 | 1 | 2 | 2 | 2 | ... | 2 | 2 | 2 |

| GIOn | 0 | 1 | 2 | 3 | 4 | 5 | 6 | ... | 125 | 126 | 127 |
|---|---|---|---|---|---|---|---|---|---|---|---|
| F1S(n) | 0 | 0 | 1 | 1 | 1 | 1 | 1 | ... | 1 | 1 | 1 |
| F2S(n) | 0 | 0 | 0 | 0 | 0 | 1 | 1 | ... | 1 | 1 | 1 |
| SHIFT COUNT | 0 | 0 | 1 | 1 | 2 | 2 | 2 | ... | 2 | 2 | 2 |

| GIOn | 0 | 1 | 2 | 3 | 4 | 5 | 6 | ... | 125 | 126 | 127 |
|---|---|---|---|---|---|---|---|---|---|---|---|
| F1S(n) | 0 | 0 | 0 | 0 | 0 | 1 | 1 | ... | 1 | 1 | 1 |
| F2S(n) | 0 | 0 | 1 | 1 | 1 | 1 | 1 | ... | 1 | 1 | 1 |
| SHIFT COUNT | 0 | 0 | 1 | 1 | 2 | 2 | 2 | ... | 2 | 2 | 2 |

SEMICONDUCTOR MEMORY DEVICE FOR IMPROVEMENT OF DEFECTIVE DATA LINE RELIEF RATE

BACKGROUND OF THE INVENTION

1. Field of the Invention

The present invention relates to a semiconductor memory device, and more particularly relates to a semiconductor memory device having a shift-type redundant configuration.

2. Description of the Background Art

Recently, demand for semiconductor memory devices having high access speed and operating with low power consumption has been risen. As semiconductor memory devices which meet such demand, there is known a shift type semiconductor memory device.

As for the recent semiconductor memory devices which have been highly integrated, it is quite difficult to manufacture defect-free products. Therefore, redundant elements are provided in a semiconductor memory. device in advance, a defective part in which defect is generated in manufacturing processes is not used but a redundant element is used in place of the defective part, thereby improving yield.

However, the number of redundant elements is generally small in a shift type semiconductor memory device and there is a limit to the improvement of yield. In order to improve yield, therefore, a technique of increasing the number of redundant elements is disclosed in, for example, Japanese Patent Laying-Open No. 2000-100191 (hereinafter, referred to as "conventional technique").

However, the conventional technique has a configuration in which a circuit for controlling a switching section which realizes shift type uses the result of the output signal of an adjacent circuit by propagating the result to the circuit. Therefore, it takes certain time to determine all shift states. In the case where a shift state is switched at real time for each access, access speed is disadvantageously decreased.

Further, according to the conventional technique, only two redundant elements for relieving defective parts are provided, which is insufficient to improve yield.

SUMMARY OF THE INVENTION

It is an object of the preset invention to provide a semiconductor memory device capable of improving yield by switching a shift state at real time for each access to a memory cell without causing a decrease in access speed.

The present invention, in summary, is directed to a semiconductor memory device including: a memory cell array having a plurality of memory cells arranged therein, the memory cell array including (L+M) local data lines numbered first to (L+M)th in order in advance, where L is an integer not less than 2 and M is a natural number less than the L, the (L+M) local data lines including: L normal data lines, transmitting input/output data in parallel; and M spare data lines, each provided to relieve a defect for each normal data line among the L normal data lines, the semiconductor memory device further including: L global data lines for transmitting the input/output data to the memory cell array; a data line switching circuit provided between the (L+M) local data lines and the L global data lines; and a switching control circuit for controlling the data line switching circuit, the data line switching circuit including L switch circuits provided in correspondence with the L global data lines, respectively, among the L switch circuits, the Jth switch circuit selectively connecting the corresponding Jth global data line to one of the Jth to (J+K)th local data lines among the (L+M) local data lines in accordance with an indicated shift count K, where J is a natural number not more than the L, and K is an integer not less than 0 and not more than M, the switching control circuit including: M program circuits, each capable of storing a defective address for specifying the normal data line corresponding to the defect among the L normal data lines; M first decoders provided in correspondence with the M program circuits, respectively; and a second decoder indicating the shift count K to each of the L switch circuits in accordance with M outputs of the M program circuits, each of the M first decoders outputting, in parallel, L determination results as to whether a shift according to each of the L switch circuits can be made when the normal data line corresponding to the defective address stored in the corresponding program circuit is relieved, and the second decoder calculating L of the shift count K respectively corresponding to the L switch circuits, in accordance with M sets of the L determination results outputted from the M first decoders, respectively.

Therefore, a main advantage of the present invention is in that the defective addresses can be decoded at high speed by parallel processing by providing a switching circuit including a plurality of switches which selectively connect one of a plurality of normal data lines and spare data lines included in a memory cell array to one of a plurality of global data lines for transmitting input/output data to the memory cell array, and a switching control circuit including a shift decoder having decode circuits for decoding a defective address stored in a program circuit as many as the switches. Accordingly, the shift states of a plurality of switches are determined at high speed. Consequently, it is possible to switch the shift states of a plurality of switches for each access to a memory cell with hardly decreasing access speed. Accordingly, it is possible to capable of improving yield.

The foregoing and other objects, features, aspects and advantages of the present invention will become more apparent from the following detailed description of the present invention when taken in conjunction with the accompanying drawings.

DESCRIPTION OF THE DRAWINGS

FIG. 5 shows the relationship between data line addresses and signals inputted to the decode circuit;

DESCRIPTION OF THE PREFERRED EMBODIMENTS

Hereinafter, embodiments of the present invention will be described with reference to the drawings. In the figures, the same reference symbols denote the same or corresponding elements, respectively.

First Embodiment

Figure 1:
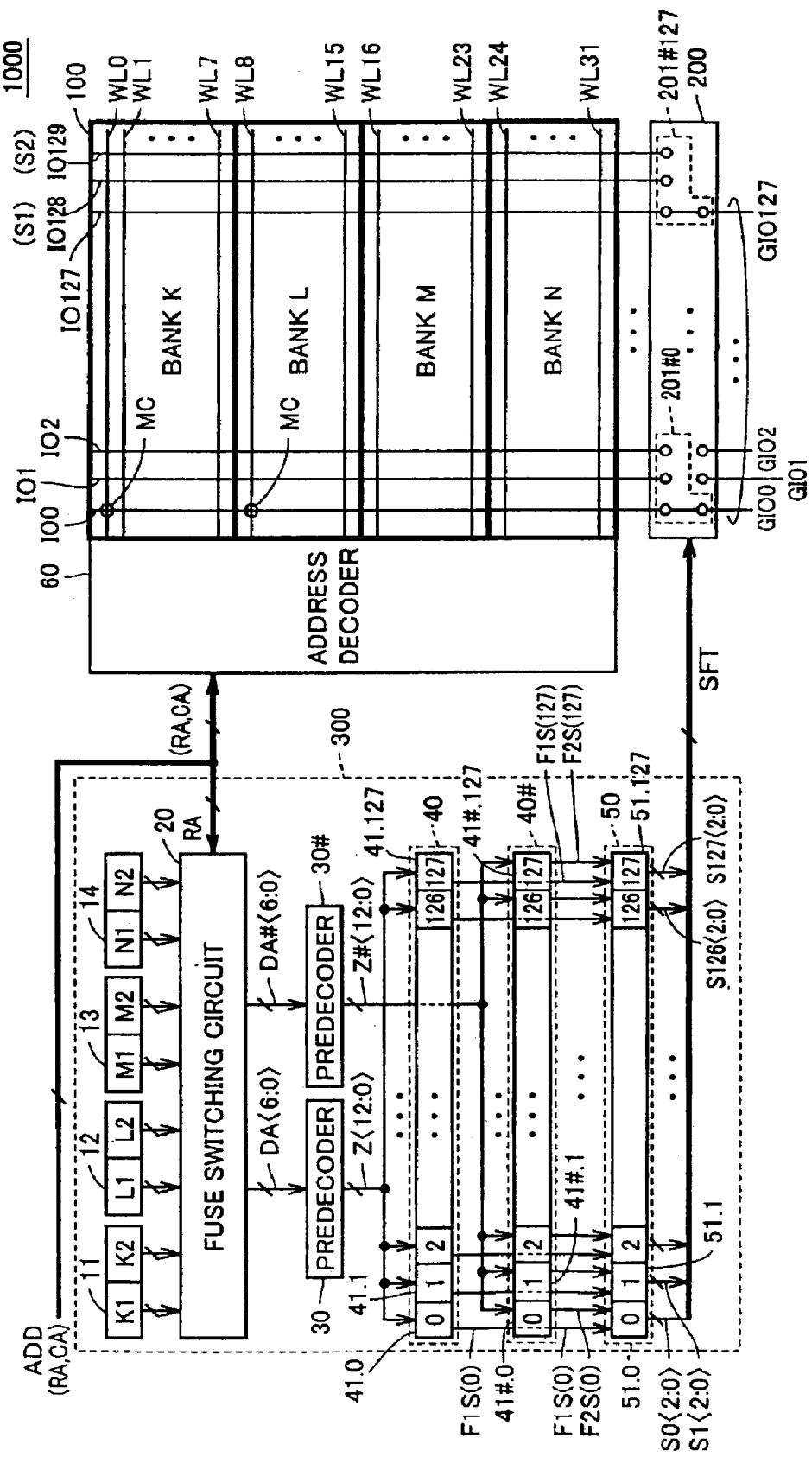
FIG. 1 is a block diagram showing one example of the configuration of a semiconductor memory device according to a first embodiment of the present invention.

With reference to FIG. 1, a semiconductor memory device 1000 includes a memory array 100 which has a plurality of memory cells MC arranged in a matrix, and an address decoder 60.

Memory array 100 includes: data lines IO0 to IO129 arranged in correspondence with the columns of memory cells; and word lines WL0 to WL31 arranged in correspondence with the rows of the memory cells, respectively. In the following description, in the case where data lines IO0 to IO129 and word lines WL0 to WL31 are expressed generically, they will be also referred to as data lines IO and word lines WL, respectively. In addition, the number of data lines IO and that of word lines WL are given as an example, and more data lines IO and more word lines WL may be provided. When there exists data line IO which is electrically connected to a defective memory cell during data read and data write (which data line IO will be also referred to as "defective data line IO" hereinafter), defective data line IO is not used but data lines.IO128 (S1) and IO129 (S2) are used as spare data lines. Therefore, data lines IO0 to IO127 will be also referred to as "normal data lines IO". In the following description, an address specifying defective data line IO will be also referred to as "defective data line address". For example, the defective data line address of defective data line IO2 is "2". In addition, an address specifying data line IO will be also referred to as "data line address". For example, the data line address of data line IO2 is "2".

As one example, memory array 100 is divided into banks K, L, M and N which include word lines WL0 to WL7, word line WL8 to WL15, word lines WL16 to WL23, and word lines WL24 to WL31, respectively.

When a row address signal RA and a column address signal CA in an address signal ADD are inputted, address decoder 60 selects a desired memory cell (hereinafter, also referred to as "selected memory cell") in memory array 100.

Figure 2:
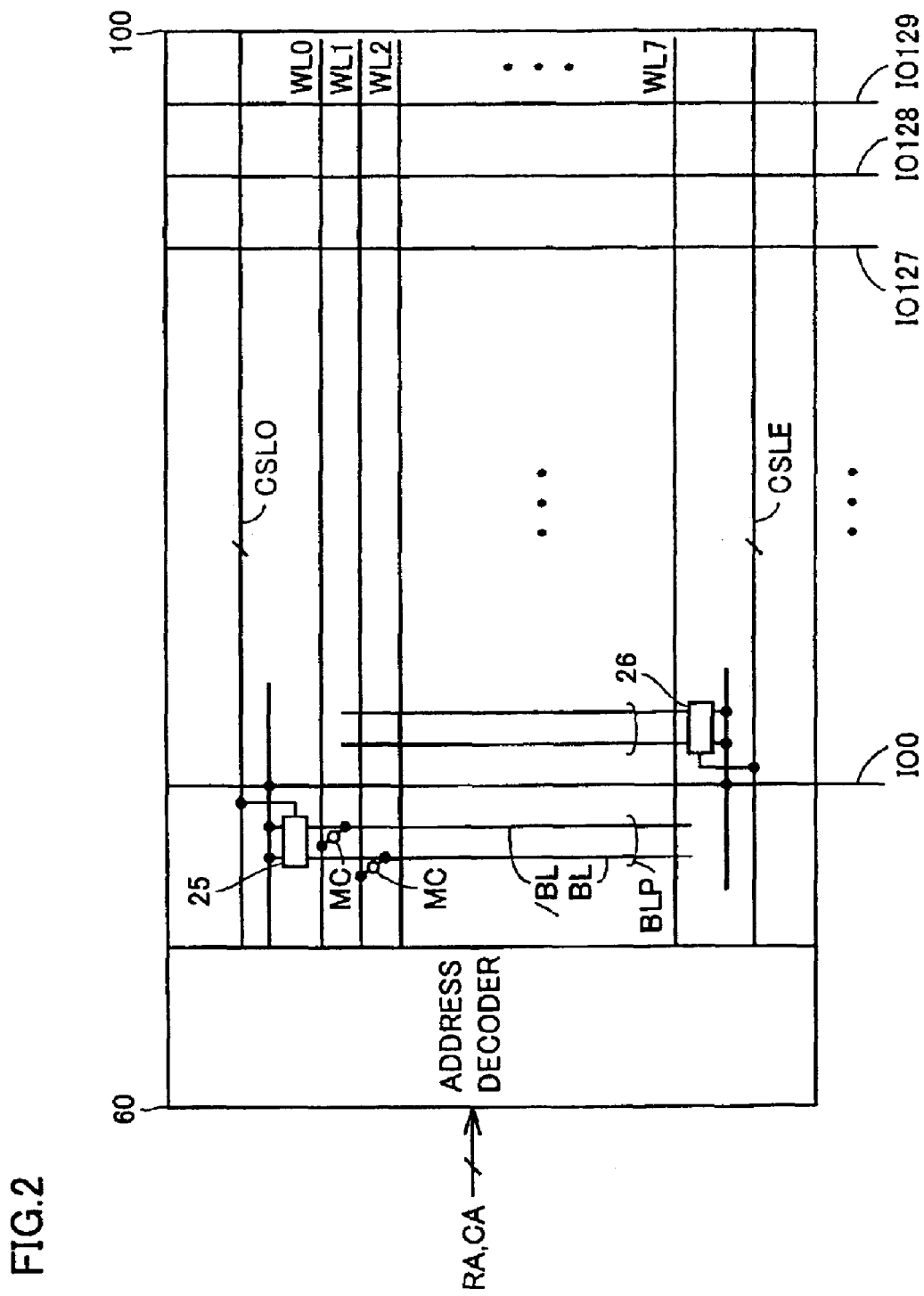
FIG. 2 is a schematic diagram showing the internal configuration of one of a plurality of banks in a memory array.

FIG. 2 shows address decoder 60 for its description.

With reference to FIG. 2, it is assumed that bank shown in memory array 100 is bank K, for example. Bank K in memory array 100 includes a bit line pair BLP, read amplifer/write driver circuits 25 and 26, column select lines CSLO and CSLE.

Bit line pairs BLP are arranged in correspondence with the columns of memory cells, respectively. Each bit line pair is formed of bit lines BL and /BL complementary to each other. Memory cell MC is electrically connected between word line WL0 and bit line /BL. Memory cell MC is electrically connected between word line WL1 and bit line BL. Namely, memory cells are provided in a column direction between bit lines /BL and the word lines in even-numbered rows, respectively. Memory cells MC are provided in the column direction between bit lines BL and the word lines in odd-numbered rows, respectively. In the following description, bit line pair BLP to which a plurality of memory cells are connected will be also referred to as "bit line pair column".

Word line WL is selectively activated in response to row address RA inputted to address decoder 60.

Each of read amplifier/write driver circuits 25 and 26 is electrically connected alternately to one end and the other end of every other bit line pair BLP in the row direction. Read amplifier/write driver circuits 25 and 26 are electrically connected to one ends of odd-numbered columns of the bit line pair columns and the other ends of even-numbered columns of the bit line pair columns, respectively. Read amplifier/write driver circuit 25 is electrically connected column select line CSLO. Read amplifier/write driver circuit 26 is electrically connected to column select line CSLE. In this embodiment, it is assumed that, for example, two read amplifier/write driver circuits are connected to each data line IO.

Read amplifier/write driver circuit 25 is activated by a column select signal transmitted by column select line CSLO in response to column address signal CA inputted to address decoder 60, and electrically connects a selected memory cell to data line IO0. Read amplifier/write driver circuit 26 is activated by a column select signal transmitted by column select line CSLE in response to column address signal CA inputted to address decoder 60, and electrically connects a selected memory cell to data line IO0. In this embodiment, two read amplifier/write driver circuits are connected to one data line IO. However, the number of read amplifier/write driver circuits is not limited to two, but may be three or more.

During data read, read amplifier/write driver circuit 25 amplifies the data of the selected memory cell, and outputs the amplified data to corresponding data line IO0. During data write, read amplifier/write driver circuit 25 writes data inputted from corresponding data line IO0 to the selected memory cell.

With reference to FIG. 1 again, semiconductor memory device 1000 also includes a switching control circuit 300.

Switching control circuit 300 includes: fuse circuits 11, 12, 13 and 14 provided in correspondence with banks K, L, M and N, respectively; a fuse switching circuit 20; and predecoders 30 and 30#.

Fuse circuits 11, 12, 13 and 14 have fuse groups K1 and K2, L1 and L2, M1 and M2, and N1 and N2 capable of storing defective data line addresses in correspondence with banks K, L, M and N, respectively. In each fuse group, programmable electric fuses by being applied with a high voltage are employed. The defective data line address programmed in each fuse group is outputted to fuse switching circuit 20. In semiconductor memory device 1000 in the first embodiment, in the case where two defective data line addresses are to be programmed by two fuse groups in a fuse circuit, a value obtained by subtracting 1 from a higher defective data address is programmed so as to electrically connect a data line GIO to be described later to desired data line IO. For example, in the case where two defective data line addresses are "10" and "20", "19" obtained by subtracting "1" from "20" is programmed in the fuse group.

In this embodiment, it is assumed that in the case where the two defective data line addresses are to be programmed by the two fuse groups, the value obtained by subtracting 1 from the higher defective data line address is programmed in each of fuse groups K2, L2, M2, and N2. In the following description, the defective data line address programmed in the fuse group in the fuse circuit will be also referred to as "fuse program address".

Row address RA is inputted to fuse switching circuit 20. Fuse switching circuit 20 selectively outputs signals from the fuse groups to predecoders 30 and 30# in accordance with the bank including word line WL selected by row address RA.

For example, in the case where word line WL in bank K is selected by address decoder 60, fuse switching circuit 20 outputs signals inputted from fuse groups K1 and K2 in fuse circuit 11 to predecoders 30 and 30# as fuse signals DA<6:0> and DA#<6:0>, respectively.

Herein, DA<6:0> generically expresses DA<0> to DA<6>. It is noted that, in the present specification, this applies to a case where signals of a plurality of bits are to be generically expressed. In addition, a binary high voltage state (e.g., a power supply voltage Vcc) and a low voltage state (e.g., a ground voltage GND) of a signal, data or the like will be also referred to as "H-level ("1")" and "L-level ("0")", respectively.

Figure 3:
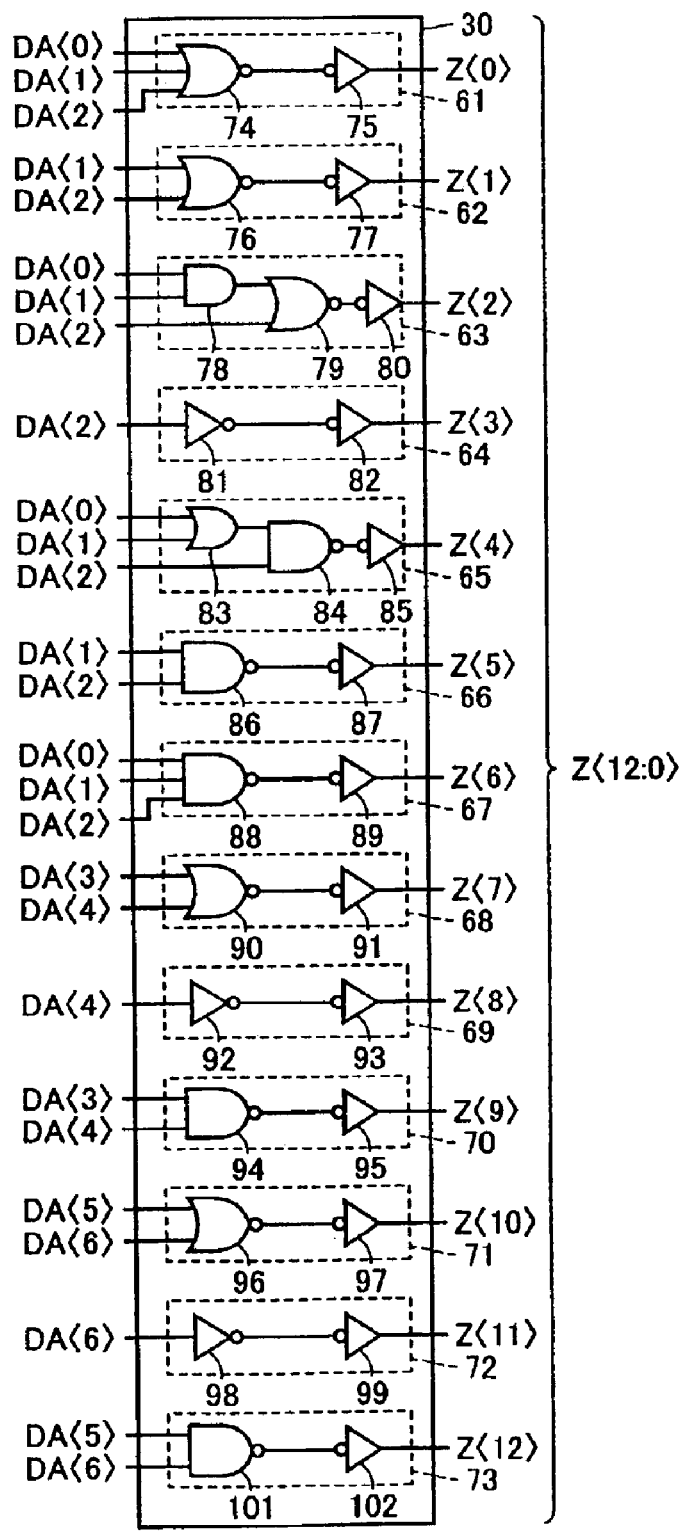
FIG. 3 is a circuit diagram showing the internal configuration of a predecoder.

With reference to FIG. 3, predecoder 30 includes signal conversion circuits 61, 62, 63, 64, 65, 66, 67, 68, 69, 70, 71, 72 and 73.

Signal conversion circuit 61 has a NOR circuit 74 and an inverter 75. NOR circuit 74 outputs a signal obtained by performing a NOR operation among fuse signals DA<0>, DA<1> and DA<2>. Inverter 75 outputs a signal at level inverted from that of the output signal of NOR circuit 74 as a signal Z<0>.

Signal conversion circuit 62 has a NOR circuit 76 and an inverter 77. NOR circuit 76 outputs a signal obtained by performing a NOR operation between fuse signals DA<1> and DA<2>. Inverter 77 outputs a signal at level inverted from that of the output signal of NOR circuit 76 as a signal Z<1>.

Signal conversion circuit 63 has an AND circuit 78, a NOR circuit 79 and an inverter 80. AND circuit 78 outputs a signal obtained by performing an AND operation between fuse signals DA<0> and DA<1>. NOR circuit 79 outputs a signal obtained by performing a NOR operation between the output signal of AND circuit 78 and fuse signal DA<2>. Inverter 80 outputs a signal at level inverted from that of the output signal of NOR circuit 79 as a signal Z<2>.

Signal conversion circuit 64 has inverters 81 and 82. Inverter 81 outputs a signal at inverted level from that of fuse signal DA<2>. Inverter 82 outputs a signal at inverted level from that of the output signal of inverter 81 as a signal Z<3>.

Signal conversion circuit 65 has an OR circuit 83, a NAND circuit 84, and an inverter 85. OR circuit 83 outputs a signal obtained by performing an OR operation between fuse signals DA<0> and DA<1>. NAND circuit 84 outputs a signal obtained by performing a NAND operation between the output signal of OR circuit 83 and fuse signal DA<2>. Inverter 85 outputs a signal at inverted level from that of the output signal of NAND circuit 84 as a signal Z<4>.

Signal conversion circuit 66 has a NAND circuit 86 and an inverter 87. NAND circuit 86 outputs a signal obtained by performing a NAND operation between fuse signals DA<1> and DA<2>. Inverter 87 outputs a signal at inverted level from that of the output signal of NAND circuit 86 as a signal Z<5>.

Signal conversion circuit 67 has a NAND circuit 88 and an inverter 89. NAND circuit 88 outputs a signal obtained by performing a NAND operation among fuse signals DA<0>, DA<1> and DA<2>. Inverter 89 outputs a signal at inverted level from that of the output signal of NAND circuit 88 as a signal Z<6>.

Signal conversion circuit 68 has a NOR circuit 90 and an inverter 91. NOR circuit 90 outputs a signal obtained by performing a NOR operation between fuse signals DA<3> and DA<4>. Inverter 91 outputs a signal at inverted level from that of the output signal of NOR circuit 90 as a signal Z<7>.

Signal conversion circuit 69 has inverters 92 and 93. Inverter 92 outputs a signal at inverted level from that of fuse signal DA<4>. Inverter 93 outputs a signal at inverted level from that of the output signal of inverter 92 as a signal Z<8>.

Signal conversion circuit 70 has a NAND circuit 94 and an inverter 95. NAND circuits 94 output a signal obtained by performing a NAND operation between fuse signals DA<3> and DA<4>. Inverter 95 outputs a signal at inverted level from that of the output signal of NAND circuit 94 as a signal Z<9>.

Signal conversion circuit 71 has a NOR circuit 96 and an inverter 97. NOR circuit 96 outputs a signal obtained by performing a NOR operation between fuse signals DA<5> and DA<6>. Inverter 97 outputs a signal at inverted level from that of the output signal of NOR circuit 96 as a signal Z<10>.

Signal conversion circuit 72 has inverters 98 and 99. Inverter 98 outputs a signal at inverted level from that of fuse signal DA<6>. Inverter 99 outputs a signal at inverted level from that of the output signal of inverter 98 as a signal Z<11>.

Signal conversion circuit 73 has a NAND circuit 101 and an inverter 102. NAND circuit 101 outputs a signal obtained by performing a NAND operation between fuse signals DA<5> and DA<6>. Inverter 102 outputs a signal at inverted level from that of the output signal of NAND circuit 101 as a signal Z<12>.

More specifically, predecoder 30 converts 7-bit fuse signals DA<6:0>from fuse switching circuit 20 into 13-bit signals Z<12:0> and outputs signals Z<12:0>.

With reference to FIG. 1 again, predecoder 30# has the configuration and function similar to those of predecoder 30, and converts 7-bit fuse signals DA#<6:0> from fuse switching circuit 20 into 13-bit signals Z#<12:0> and outputs signals Z#<12:0>.

Switching control circuit 300 further includes shift decoders 40 and 40#. Each of shift decoders 40 and 40# has decode circuits as many as normal data lines IO. In this embodiment, since memory array 100 includes 128 normal data lines IO, shift decoders 40 has decode circuits 41.0 to 41.127 corresponding to data lines IO0 to IO127, respectively. Shift decoders #40 has decode circuits 41#.0 to 41#.127 corresponding to data lines IO0 to IO127, respectively.

In the following description, in the case where decode circuits 41.0 to 41.127 and 40#.0 to 40#.127 are expressed generically, they will be also referred to as "decode circuits 41.n" and "decode circuits 41#.n", respectively. Signals Z<12:0> are inputted to decode circuits 41.n, respectively. Signals Z#<12:0> are inputted to decode circuits 41#.n, respectively. In addition, symbol n used in decode circuit 41.n represents nth decode circuit 41. This also applies hereinafter when symbol n is used.

Decode circuit 41.n converts signals Z<12:0> into a shift signal F1S(n) and outputs shift signal F1S(n). Decode circuit 41#.n converts signals Z#<12:0> into a shift signals F2S(n) and outputs shift signals F2S(n). For example, decode circuits 41.1 and 41#.1 output shift signals F1S(1) and F2S(1), respectively.

In addition, shift signals F1S(n) and F2S(n) determine the shift count of the witch circuit which selectively connects data lines IO and GIO to be described later. For example, in the case where shift signals F1S(n) and F2S(n) are both at L-level, the shift count of the switch circuit is set at 0. In the case where only one of shift signals F1S(n) and F2S(n) is at H-level, the shift count of the switch circuit is set at 0. If shift signals F1S(n) and F2S(n) are both at H-level, the shift count of the switch circuit is set at 2.

Figure 4:
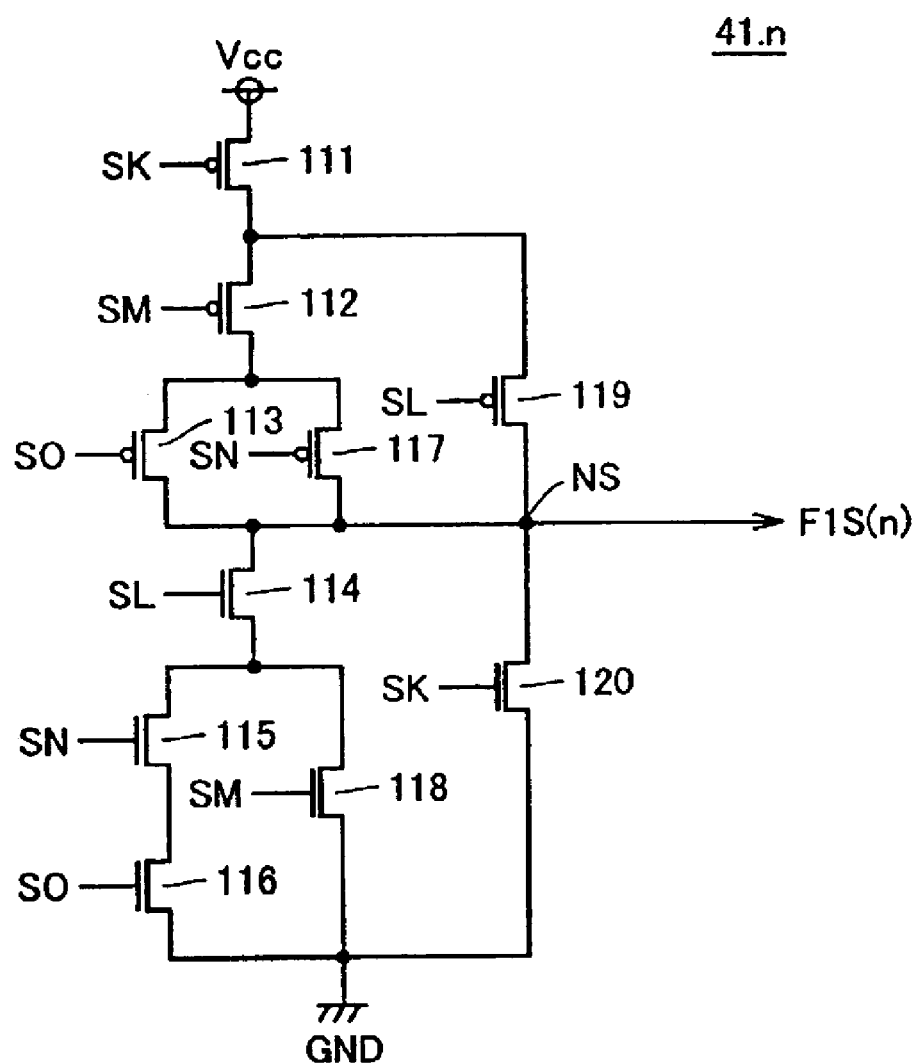
FIG. 4 is a circuit diagram showing the configuration of a decode circuit.

With reference to FIG. 4, decode circuit 41.n has: P-channel MOS transistors 111, 112 and 113 which are connected in series between power supply voltage Vcc and a connection node NS; and N-channel MOS transistors 114, 115 and 116 which are connected in series between connection node NS and ground voltage GND. Signals SK, SM and SO are inputted to the gates of P-channel MOS transistors 111, 112 and 113, respectively. Signals SL, SN and SO are inputted to the gates of N-channel MOS transistors 114, 115 and 116, respectively.

Each of signals SK, SL, SN and SO is one of signals Z<12:0> which are output signals of predecoder 30. The correspondence between signals SK, SL, SM, SN, and SO and signals Z<12:0>, as will be described later in detail, is specified by data line addresses.

Decode circuit 41.n also has P-channel MOS transistors 117 and 119, and N-channel MOS transistors 118 and 120.

P-channel MOS transistor 117 is provided between the connection node between P-channel MOS transistors 112 and 113, and connection node NS. Signal SN is inputted to the gate of P-channel MOS transistor 117. N-channel MOS transistor 118 is provided between the connection node between N-channel MOS transistors 114 and 115, and ground voltage GND. Signal SM is inputted to the gate of N-channel MOS transistor 118.

P-channel MOS transistor 119 is provided between the connection node between P-channel MOS transistors 111 and 112, and connection node NS. Signal SL is inputted to the gate of P-channel MOS transistor 119. N-channel MOS transistor 120 is provided between connection node NS and ground voltage GND. Signal SK is inputted to the gate of N-channel MOS transistor 120.

As will be described later in detail, decode circuit 41.n outputs shift signal F1S(n) in accordance with the signals inputted to the respective transistors.

With reference to FIG. 5, signal SK will be described first. In the case where data line addresses are "0" to "31", signal SK is set at signal Z<10>. In the case where data line addresses are "32" to "63", signal SK is set at signal Z<11>. Likewise, in the case where data line addresses are "64" to "95", signal SK is set at signal Z<12>. In the case where data line addresses are "96" to "127", signal SK is set at L-level.

Since signal SL is set similarly to signal SK as shown in the figure, it will not be described herein repeatedly in detail.

In the case where data line addresses are "0" to "7", signal SM is set at signal Z<7>. In the case where data line addresses are "8" to "15", signal SM is set at signal Z<8>. In the case where data line addresses are "16" to "23", signal SM is set at Z<9>. In the case where data line addresses are "24" to "31", signal SM is set at L-level.

In the case where data line addresses are "32" to "63", signal SM is set similarly to the case of a data line address obtained by subtracting "32" from each data line address. For example, in the case where data line address is "40", signal SM is set at signal Z<8> similarly to a case where data address is "8". In the case where data line addresses are "64" to "95", signal SM is set similarly to the case of a data line address obtained by subtracting "64" from each data line address. In the case where data line addresses are "96" to "127", signal SM is set similarly to the case of a data line address obtained by subtracting "96" from each data line address. Since signal SN is set similarly to signal SM as shown in the figure, it will not be described herein repeatedly.

In the case where data line addresses are "0" to "6", signal SO is set at signals Z<0> to Z<6>, respectively. In the case where data line address is "7", signal SO is set at L-level. In the case where data line addresses are "8" to "15", signal SO is set similarly to the case of a data line address obtained by subtracting "8" from each data line address. For example, in the case where data line address is "10", signal SM is set at signal Z<2>similarly to a case where data line address is "2". In the case where data line addresses are "16" to "23", signal SO is set similarly to the case of a data line address obtained by subtracting "16" from each data line address. In the case where data line addresses are "24" to "31", signal SO is set similarly to the case of a data line address obtained by subtracting "24" from each data line address.

In the case where data line addresses are "32" to "63", signal SO is set similarly to the case of a data line address obtained by subtracting "32" from each data line address. In the case where data line addresses are "64" to "95", signal SO is set similarly to the case of a data line address obtained by subtracting "64" from each data line address. In the case where data line addresses are "96" to "127", signal SO is set similarly to the case of a data line address obtained by subtracting "96" from each data line address.

Figures 6, 7:
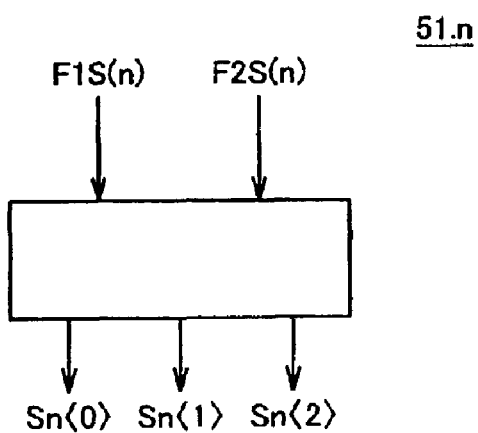
FIG. 6 shows the relationship between fuse program addresses, and fuse signals and shift signals.
FIG. 7 is a block diagram showing the configuration of a multi-stage shift decode circuit.

In FIG. 6, shift signals F1S(n) and F2S(n) are signals obtained by converting signals Z<12:0> by decode circuits 41.n and 41#.n, respectively.

With reference to FIG. 6, in the case where shift signals F1S(n) and F2S(n) corresponding to a fuse program address are "0", shift signals F1S(n) and F2S(n) are set at L-level. On the other hand, in the case where shift signals F1S(n) and F2S(n) corresponding to a fuse program address are "1", shift signals F1S(n) and F2S(n) are set at H-level. In the initial setting, the fuse groups are not programmable, and all of shift signals F1S(0) to F1S(127) and F2S(0) to F2S(127) are set at L-level.

For example, the fuse group is programmed so that in the case where the fuse program address is "1", the signals outputted from the fuse group by fuse switching circuit 20 as fuse signals DA<6:0> are set at "0, 0, 0, 0, 0, 0, 1", respectively. In this case, shift signals F1S(0) and F2S(0) are both set at L-level, and shift signals F1S(1) to F1S(127) and F2S(1) to F2S(127) are set at H-level, respectively.

Next, with reference to FIGS. 1, 3, 4 and 5, description will be given of the operations of predecoder 30 and decode circuit 41.n when "2" is programmed as the defective data line address in fuse group K1 in fuse circuit 11.

The signals outputted from fuse group K1 are inputted as fuse signals DA<6:0> to predecoder 30 by fuse switching circuit 20. Since "2" is programmed as the defective data line address, fuse signals DA<6:0> are set at "0, 0, 0, 0, 0, 1, 0", respectively. More specifically, fuse signals DA<6> to DA<0> are set at "0", "0", "0", "0", "0", "1" and "0", respectively. Therefore, only fuse signal DA<1> is set at "1" (H-level) whereas fuse signals DA<6> to DA<2> and DA<0> are set at "0" (L-level).

Since only fuse signal DA<1> among fuse signals DA<6:0> is set at H-level, predecoder 30 sets signals Z<0> and Z<1> at H-level ("1"). In addition, predecoder 30 sets signals Z<2> to Z<12> at L-level ("0"). More specifically, signals Z<12:0> are set at "0, 0, 0, 0, 0, 0, 0, 0, 0, 0, 0, 1, 1>, respectively.

As shown in FIG. 5, in the case where the defective data address is "2", signals SK, SL, SM, SN and SO are set at L-level signal Z<10>, H-level, L-level signal Z<7>, H-level, and L-level signal Z<2>, respectively.

Signals SK, SL, SM, SN and SO are inputted to the gates of the respective transistors in decode circuit 41.2 corresponding to the defective data address "2". As a result, P-channel MOS transistors 111, 112 and 113 are turned on, and shift signal F1S(2) is set at H-level.

With reference to FIG. 1 again, decode circuit 41#.n has the configuration and function similar to those of decode circuit 41.n. Therefore, by the operation similar to that of decode circuit 41.n, decode circuit 40#.n converts signals Z#<12:0> from predecoder 30# into shift signal F2S(n) and output shift signal F2S(n).

Switching control circuit 300 further includes a multi-stage shift decoder 50.

Multi-stage shift decoder 50 has decode circuits as many as normal data lines IO. In this embodiment, since memory array 100 includes 128 normal data lines IO, multi-stage shift decoder 50 has multi-stage shift decode circuits 51.0 to 51.127 corresponding to data lines IO0 to IO127, respectively.

Shift signals F1S(0) to F1S(127) which are output signals from decode circuits 41.0 to 41.127 are inputted to multi-stage shift decode circuits 51.0 to 51.127, respectively. Shift signals F2S(0) to F2S(127) which are output signals from decode circuits 41#.0 to 41#.127 are inputted to multi-stage shift decode circuits 51.0 to 51.127, respectively. For example, shift signals F1S(l) and F2S(1) which are output signals from decode circuits 41.1 and 41#.1 are inputted to multi-stage shift decode circuit 51.1, respectively.

In the following description, in the case where multi-stage shift decode circuit 51.0 to 51.127 are generically expressed, they will be also referred to as "multi-stage shift decode circuits 51.n", respectively.

Multi-stage shift decode circuit 51.n converts shift signals F1S(n) and F2S(n) into shift control signals Sn<2:0> and outputs shift control signals Sn<2:0>. Since multi-stage shift decoder 50 has 128 multi-stage shift decode circuits 51.n, 128 shift control signals Sn<2:0> are outputted from multi-stage shift decoder 50. For example, multi-stage shift decode circuit 51.1 converts shift signals F1S(1) and F2S(1), which are output signals from decode circuits 41.1 and 41#.1, into shift control signals S1<2:0> and outputs shift control signals S1<2:0>.

With reference to FIG. 7, multi-stage shift decode circuit 51.n outputs shift control signals Sn<0>, Sn<1> and Sn<2> in accordance with shift signals F1S(n) and F2S(n).

Figure 8:
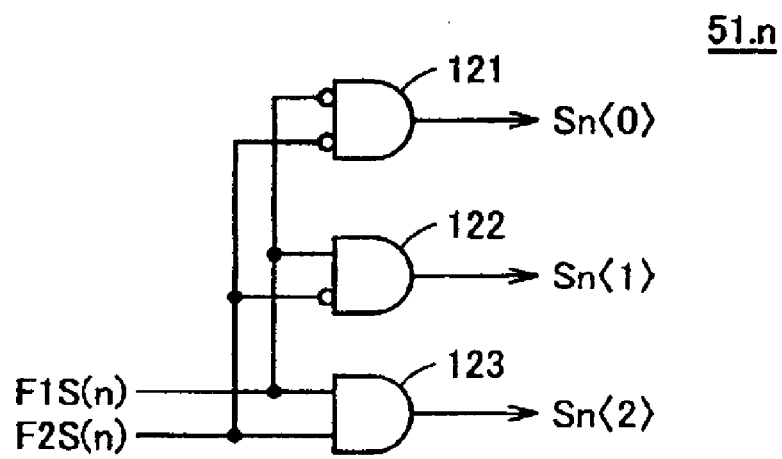
FIG. 8 is a circuit diagram showing the internal configuration of the multi-stage shift decode circuit.

With reference to FIG. 8, multi-stage shift decode circuit 51.n has logic circuits 121, 122 and 123. Logic circuit 121 outputs shift control signal Sn<0> which is a signal obtained by performing a NOR operation between shift signals F1S(n) and F2S(n). Logic circuit 122 outputs H-level shift control signal Sn<1> only in the case where shift signals F1S(n) and F2S(n) are at H-level and L-level, respectively. Logic circuit 122 outputs L-level shift control signal Sn<1> in the case where shift signals F1S(n) and F2S(n) are not H-level and L-level, respectively. Logic circuit 123 outputs shift control signal Sn<2> which is a signal obtained by performing an AND operation between shift signals F1S(n) and F2S(n).

With respect to FIG. 1 again, semiconductor memory device 1000 also includes data line switching circuit 200, and data lines GIO0 to GIO127. In the following description, in the case where data lines GIO0 to GIO127 are expressed generically, they will be also referred to as "data line GIO", respectively.

Data line switching circuit 200 has 128 switch circuits 201#0 to 201#127 for electrically connecting one data line GIO to one of three data lines IO. Shift control signals S0<2:0> to S127<2:0> are inputted to switch circuits 201#0 to 201#127, respectively. More specifically, a shift signal SFT outputted from switching control circuit 300 and inputted to switching circuit 200 is formed of 128 shift control signals S0<2:0> to S127<2:0>. In the following description, in the case where switch circuits 201#0 to 201#127 are expressed generically, they will be also referred to as "switch circuits 201#.n", respectively.

Figure 9:
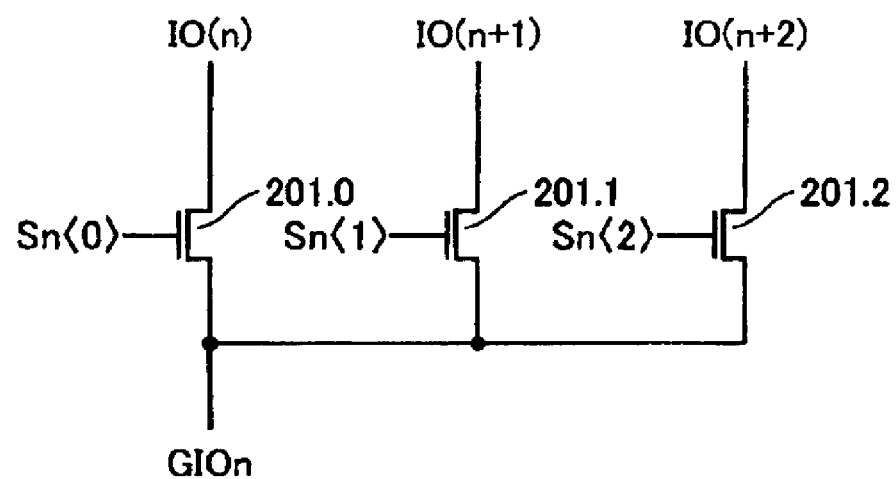
FIG. 9 is a circuit diagram showing the configuration of a switching circuit.

With reference to FIG. 9, switch circuit 201#.n has switches 201.0, 201.1 and 201.2. Switches 201.0, 201.1 and 201.2 are formed of N-channel MOS transistors as one example.

When one of shift control signals Sn<0>, Sn<1> and Sn<2> inputted to gates of switches 201.0, 201.1 and 201.2, respectively, is set at H-level, one of data lines IO(n), IO(n+1) and IO(n+2) is electrically connected to data line GIOn. Therefore, data can be transmitted/received between data lines IO and GIO.

In the case where shift control signal Sn<0> is at H-level, data lines GIOn and IO(n) are electrically connected to each other; therefore, the shift count of switch circuit 201#.n is 0. In the case where shift control signal Sn<1> is at H-level, data lines GIOn and IO(n+1) are electrically connected to each other; therefore, the shift count of switch circuit 201#.n is 1. In the case where shift control signal Sn<2> is at H-level, data lines GIOn and IO(n+2) are electrically connected to each other; therefore, the shift count of switch circuit 201#.n is 2. For example, in the case where H-level shift control signal S1<1> is inputted to the gate of switch 201.1 in switch circuit 201#.1, data line GIO1 is electrically connected to data line IO2 and the shift count of switch circuit 201#.1 is 1.

Figures 10A, 10B:
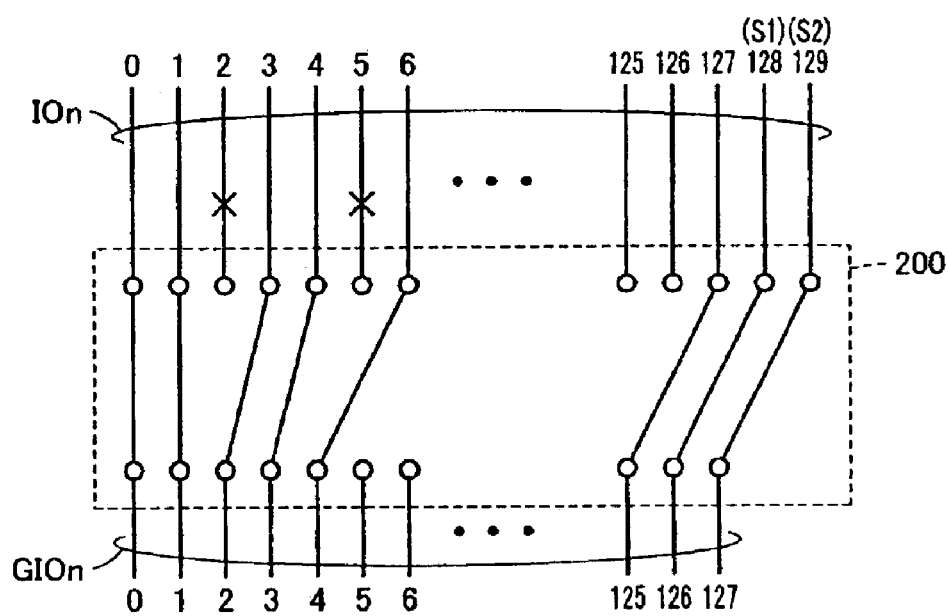
FIGS. 10A and 10B describe the operation of a data line switching circuit according to the first embodiment.

FIG. 10A shows the state of data line switching circuit 200 when a defective memory cell exists in a plurality of memory cells electrically connected to each of data lines IO2 and IO5 in bank K, for example, during data read and data write. Therefore, "2" is programmed as the defective data line address in fuse group K1. On the other hand, "4" obtained by subtracting "1" from defective data line address "5" is programmed as the defective data line address in fuse group K2.

FIG. 10B shows the output values of shift signals F1S(n) and F2S(n) which are output signals of decode circuits 41.n and 41#.n, respectively, corresponding to data line GIOn. If output value is "0", shift signal F1S(n) or F2S(n) is set at voltage level L, if output value is "1", shift signal F1S(n) or F2S(n) is set at voltage level H. In FIG. 10B, the shift count represents the sum of the output values of shift signals F1S(n) and F2S(n) outputted respectively from decode circuits 41.n and 41#.n. For example, in the case where the shift count is 0, data line GIO0 is electrically connected to data line IO0. In the case where the shift count is 1, data line GIO0 is electrically connected to data line IO1. In the case where the shift count is 2, data line GIO0 is electrically connected to data line IO2.

With reference to FIGS. 1, 6, 8, 9, 10A and 10B, description will be given of the relief operation of data line switching circuit 200 for defective data line IO.

The output signals from fuse groups K1 and K2 are outputted as fuse signals DA<6:0> and DA#<6:0> by fuse switching circuit 20, respectively, and inputted to predecoders 30 and 30#, respectively. Fuse signals DA<6:0> and DA#<6:0> are converted into signals Z<12:0> and Z#<12:0> in predecoders 30 and 30#, respectively. Signals Z<12:0> inputted to decode circuits 41.0 to 41.127 are converted by decode circuit 41.n. Signals Z#<12:0> inputted to decode circuits 41#.0 to 41#.127 are converted by decode circuit 41#.n.

As shown in FIG. 6, when the fuse program address of fuse group K1 is "2", shift signals F1S(2) to F1S(127) are set at "1" (H-level) and shift signals F1S(0) to F1S(1) are set at "0" (L-level). Likewise, when the fuse program address of fuse group K2 is "4", shift signals F2S(4) to F2S(127) are set at "1" (H-level) and shift signals F2S(0) to F2S(3) are set at "0" (L-level).

Since shift signal F1S(2) is set at H-level and shift signal F2S(2) is set at L-level, multi-stage shift decode circuit 51.2 sets shift control signals S2<0>, S2<1> and S2<2> at L-level, H-level and L-level, respectively. Shift control signals S2<0>, S2<1> and S2<2> are inputted to switch circuit 201#.2, and data line GIO2 is electrically connected to data line IO3.

On the other hand, since shift signals F1S(4) and F2S(4) are set at H-level, multi-stage shift decode circuit 51.4 sets shift control signals S4<0>, S4<1> and S4<2> at L-level, L-level and H-level, respectively. Shift control signals S4<0>, S4<1> and S4<2> are inputted to switch circuit 201#.4, and data line GIO4 is electrically connected to data line IO6.

Likewise, other data lines GIO and IO are electrically connected to each other. Finally, as a result of the operation of data line switching circuit 200, defective data line IO turns into an unusable state, making it possible to normally read and write data.

Next, description will be given of the relief operation of data line switching circuit 200 for defective data line IO when defective memory cells electrically connected to defective data line IO during data read and data write differ for every bank.

Figure 11:
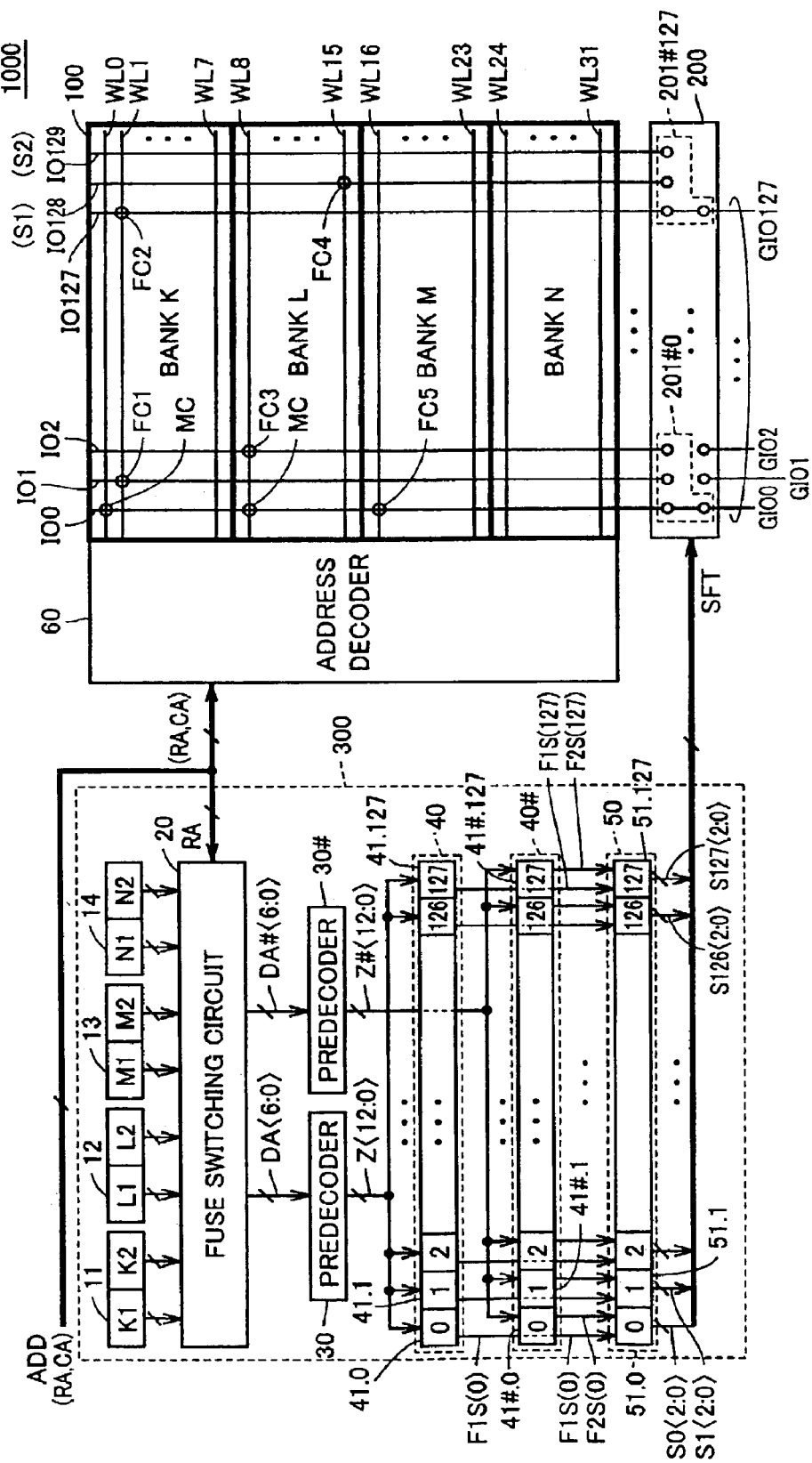
FIG. 11 is a conceptual diagram showing the state where a plurality of defective memory cells exist in the memory array of the semiconductor memory device.

With reference to FIG. 11, defective memory cells FC1 and FC2 exist in bank K of memory array 100. Defective memory cells FC1 and FC2 are connected to data lines IO1 and IO127, respectively during data read and data write. Defective memory cells FC3 and FC4 exist in bank L. Defective memory cells FC3 and FC4 are connected to data lines IO2 and IO128, respectively during data read and data write. Defective memory cell FC5 exists in bank M. Defective memory cell FC5 is connected to data line IO0 during data read and data write. No defective memory cell exists in bank N.

In the case where data is read from a selected memory cell in bank K, fuse switching circuit 20 outputs output signals from fuse groups K1 and K2 in fuse circuit 11, as fuse signals DA<6:0> and DA#<6:0>, to predecoders 30 and 30#, respectively, in response to row address RA. Since the later operations of predecoders 30 and 30#, decode circuits 41.n and 41#.n, multi-stage shift decode circuit 51.n and switch circuit 201#.n are similar to the relief operation for defective data line IO described with reference to FIGS. 10A and 10B, they will not be repeatedly described herein in detail.

Figure 12:
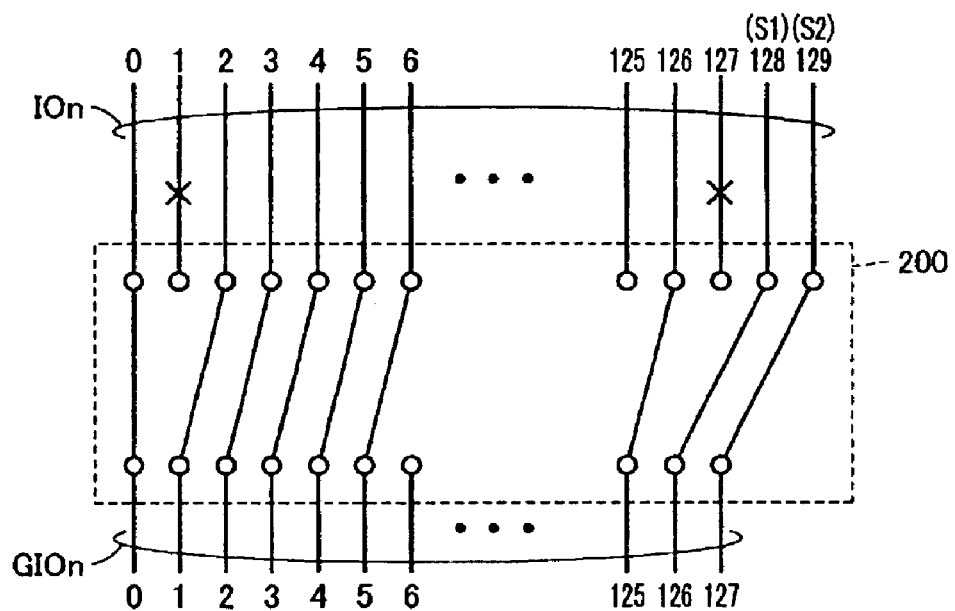
FIGS. 12 to 14 are schematic diagrams showing the states of the switching circuit when a defective memory cell is connected to a data line in a specific bank during data read and data write.

With reference to FIGS. 11 and 12, since defective memory cells FC1 and FC2 are connected to data lines IO1 and IO127, respectively during data read and data write, data line switching circuit 200 operates to electrically connect data line IO to data line GIO without using data lines IO1 and IO127. As a result, it is possible to normally read data from the selected memory cell in bank K.

In the case where data is written to a selected memory cell in bank L, fuse switching circuit 20 outputs output signals from fuse groups L1 and L2 in fuse circuit 12, as fuse signals DA<6:0> and DA#<6:0>, to predecoders 30 and 30#, respectively, in response to row address signal RA. Since the later operations of predecoders 30 and 30#, decode circuits 41.n and 41#.n, multi-stage shift decode circuit 51.n and switch circuit 201#.n are similar to the relief operation for defective data line IO described with reference to FIGS. 10A and 10B, they will not be repeatedly described herein in detail.

Figure 13:
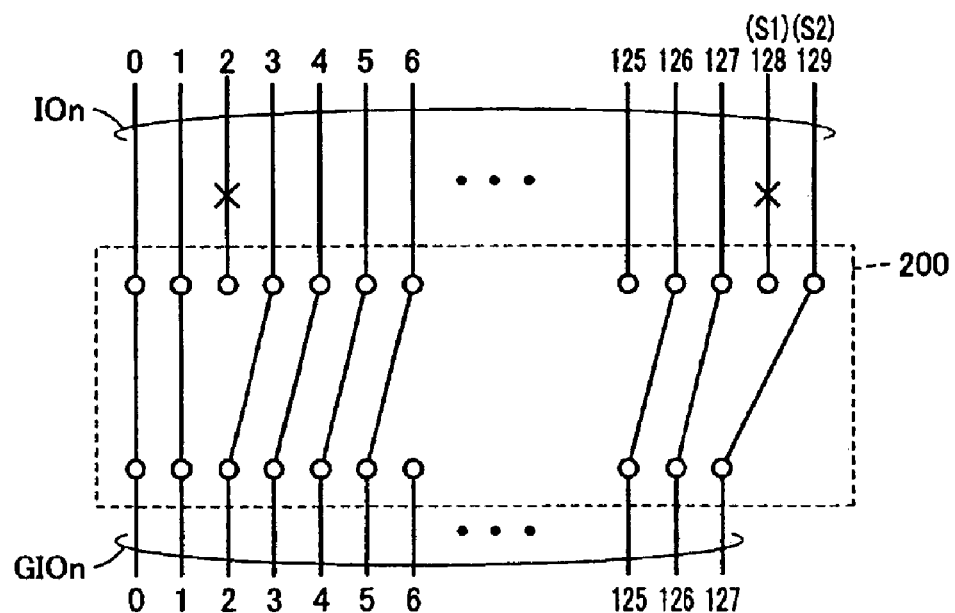

With reference to FIGS. 11 and 13, since defective memory cells FC3 and FC4 are connected to data lines IO2 and IO128 during data read and data write, data line switching circuit 200 operates to electrically connect data line IO to data line GIO without using data lines IO2 and IO128. As a result, it is possible to normally write data to the selected memory cell in bank L.

In the case where data is written to a selected memory cell in bank M, since only one defective memory cell exists in bank M, fuse switching circuit 20 outputs an output signal from one fuse group M1 in fuse circuit 13, as fuse signals DA<6:0>, to predecoder 30, in response to row address signal RA. Since the later operations of predecoder 30, decode circuit 41.n, multi-stage shift decode circuit 51.n and switch circuit 201#.n are similar to the relief operation for defective data line IO described with reference to FIGS. 10A and 10B, they will not be repeatedly described herein in detail.

Figure 14:
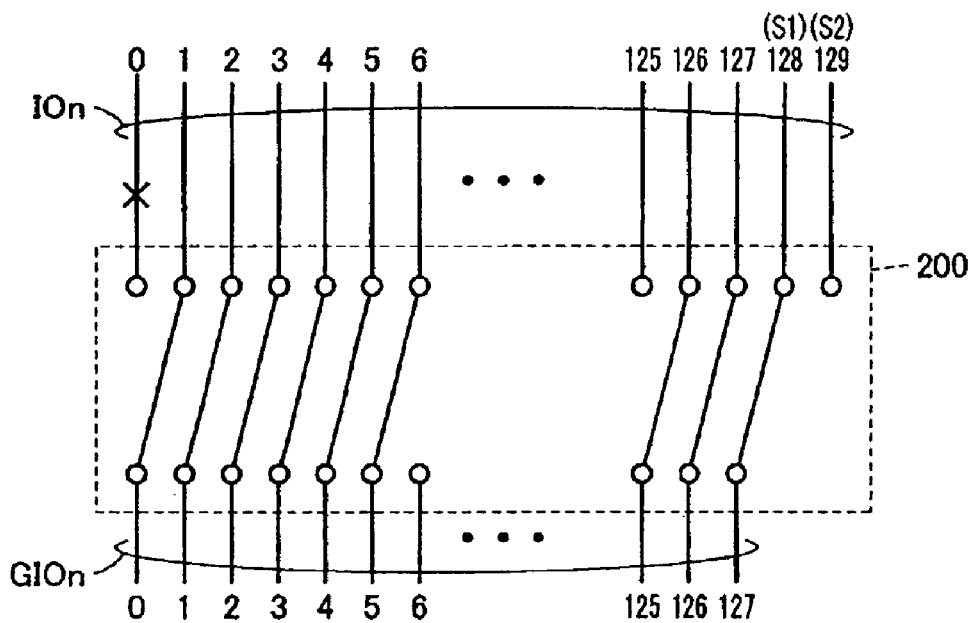

With reference to FIGS. 11 and 14, since defective memory cell FC5 is connected to data line IO0 during data read and data write, data line switching circuit 200 operates to electrically connect data line IO to data line GIO without using data line IO0. As a result, it is possible to normally write data to the selected memory cell in bank M.

In the case where data is read from a selected memory cell in bank N, since no defective memory cell exists in bank N, no defective data line addresses are programmed in fuse groups N1 and N2. Therefore, fuse switching circuit 20 does not output signals from fuse groups N1 and N2 in fuse circuit 14 in response to row address signal RA. As a result, predecoders 30 and 30#, decode circuits 41.n and 41#.n, multi-stage shift decode circuit 51.n and switch circuit 201#.n do not operate.

Figure 15:
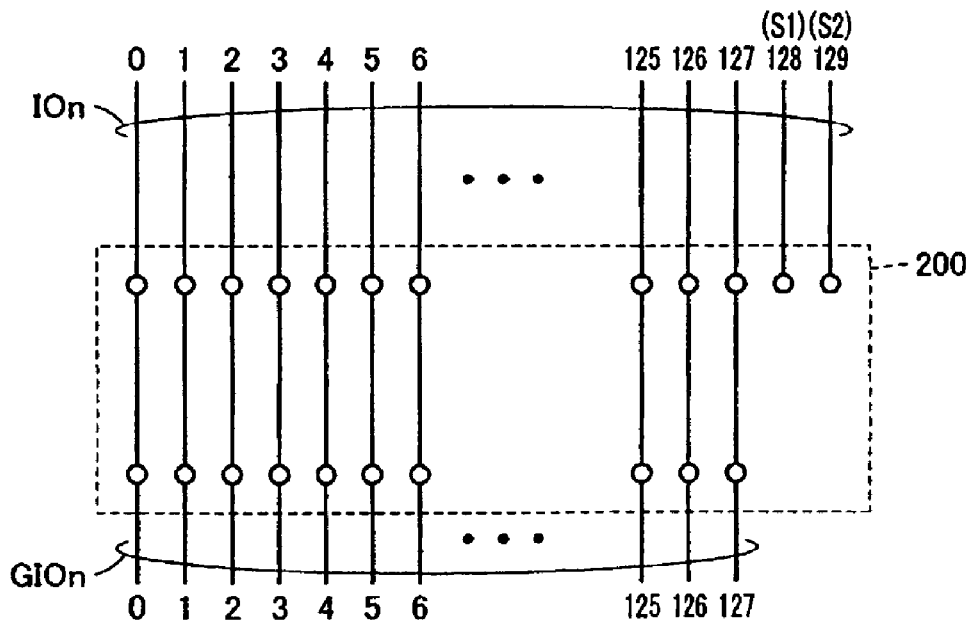
FIG. 15 is a schematic diagram showing the state of the switching circuit when no defective memory cell exists in a specific bank.

With reference to FIGS. 11 and 15, since no defective memory cell exists in bank N, data line switching circuit 200 operate to electrically connect data lines IO0 to IO127 to data lines GIO0 to GIO127, respectively. As a result, it is possible to normally read data from the desired memory cell in bank N.

As described so far, semiconductor memory device 1000 according to the first embodiment includes a plurality of decode circuits which decode fuse program addresses and which are provided in correspondence with the number of normal data lines. It is therefore possible to decode the fuse program addresses at high speed by parallel operation, and to determine a shift state in switching circuit 200 at high speed, accordingly. As a result, it is possible to switch the shift states of a plurality of switches for each access to a memory cell with almost no decrease in access speed.

Further, in semiconductor memory device 1000 according to the first embodiment, the shift states in data line switch circuit 200 are switched at real time according to the banks in which defective memory cells electrically connected to access target data lines during data read and data write exist, thereby making it possible to relieve defective data lines by as much as a maximum of the product of the number of spare data lines and the number of banks. As a result, it is possible to further improve the yield of the semiconductor memory device.

Second Embodiment

In order to drive multi-stage shift decode circuits 51.n properly in multi-stage shift decoder 50 in the configuration of semiconductor memory device 1000 according to the first embodiment, it is requisite that the defective data address programmed in fuse group K1 is lower than that programmed in fuse group K2. With reference to FIG. 6, for example, when "4" and "1" are programmed in fuse groups K1 and K2 corresponding to shift signals F1S(n) and F2S(n), shift signals F1S(1) and F2S(1) are set at "0" (L-level) and "1" (H-level), respectively. With this configuration, none of shift control signals Sn<2:0> which are the output signals of multi-stage shift decoders 51.n are set at H-level. Therefore, switches 201.0, 201.1 and 201.2 in switch circuit 201#.n are not turned on, and data cannot be read from and written to the memory cells in memory array 100. In a second embodiment, a configuration in which the limitation of the magnitude relationship between the defective data line addresses programmed to the fuse groups is eliminated will be described.

Figure 16:
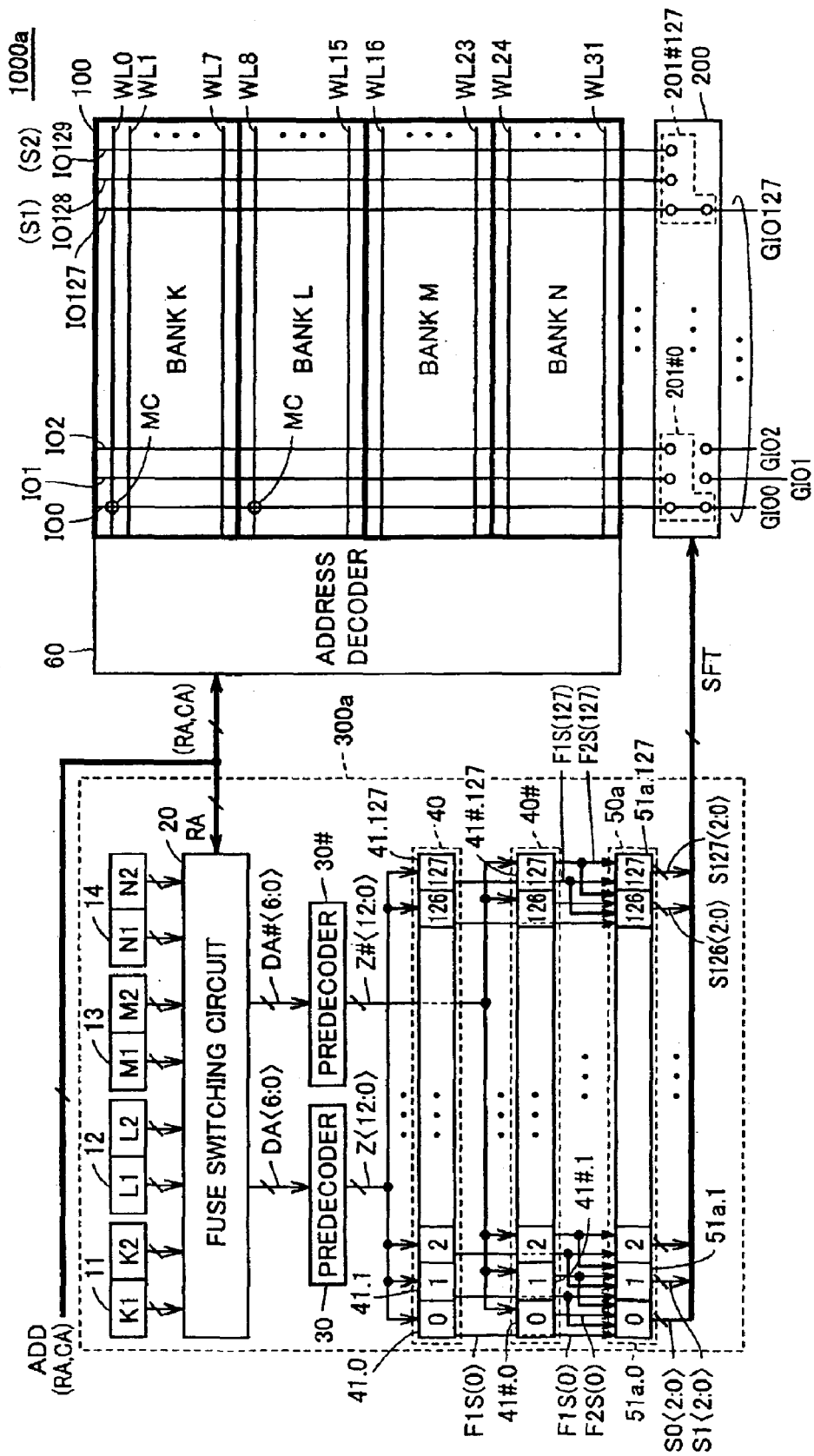
FIG. 16 is a block diagram showing one example of the configuration of a semiconductor memory device according to a second embodiment of the present invention.

With reference to FIG. 16, a semiconductor memory device 1000a differs from semiconductor memory device 1000 in that switching control circuit 300 is replaced by a switching control circuit 300a. Since the other constituent elements of semiconductor memory device 1000a are similar to those of semiconductor memory device 1000, they will not be repeatedly described herein in detail.

Switching control circuit 300a differs from switching control circuit 300 in that multi-stage shift decoder 50 is replaced by a multi-stage shift decoder 50a.

Multi-stage shift decoder 50a has decode circuits as many as normal data lines IO. In this embodiment, since memory array 100 includes 128 normal data lines IO, multi-stage shift decoder 50a has multi-stage shift decode circuits 51a.0 to 51a.127 corresponding to data lines IO0 to IO127, respectively.

Shift signals F1S(0) to F1S(126), which are output signals from decode circuits 41.0 to 41.126, are inputted to multi-stage shift decode circuits 51a.0 to 51a.126, respectively, and shift signals F2S(0) to F2S(126), which are output signals from decode circuits 41#.0 to 41#.126, are inputted to multi-stage shift decode circuits 51a.0 to 51a.126, respectively. Shift signals F1S(127) and F2S(127) are inputted to multi-stage shift decode circuit 51a.127. For example, shift signals F1S(1) and F1S(2), which are output signals from decode circuits 41.1 and 41.2, respectively, and shift signals F2S(1) and F2S(2), which are output signals from decode circuits 41#.1 and 41#.2, respectively, are inputted to multi-stage shift decode circuit 51a.1.

In the following description, in the case where multi-stage shift decode circuits 51a.0 to 51a.127 are expressed generically, they will be also referred to as "multi-stage shift decode circuits 51a.n".

Multi-stage shift decode circuit 51a.n converts shift signals F1S(n), F2S(n), F1S(n+1) and F2S(n+1) into shift control signals Sn<2:0>, respectively, and outputs shift control signals Sn<2:0>. Since multi-stage shift decoder 50a has 128 multi-stage shift decode circuits 51a.n, 128 shift control signals Sn<2:0> are outputted from multi-stage shift decoder 50a. For example, multi-stage shift decode circuit 51a.1 converts shift signals F1S(1) and F1S(2) which are output signals from decode circuits 41.1 and 41.2, and shift signals F2S(1) and F2S(2) which are output signals from decode circuits 41#.1 and 41#.2 into shift control signals S1<2:0>, respectively, and outputs shift control signals S1<2:0>.

Figure 17:
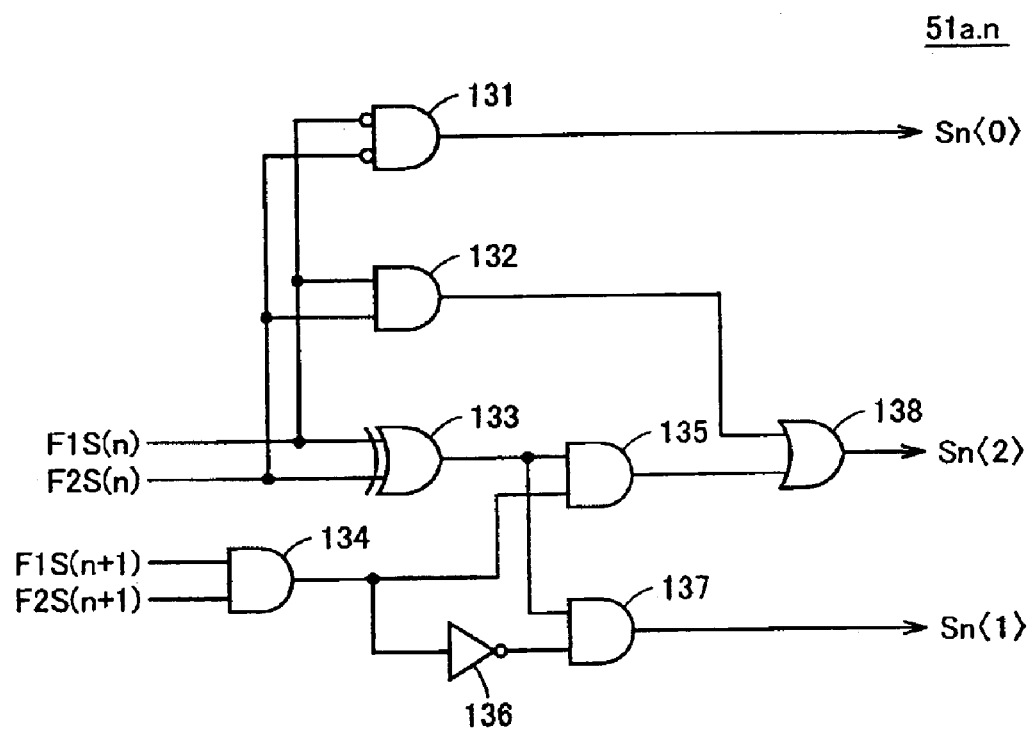
FIG. 17 is a circuit diagram showing the internal configuration of a multi-stage shift decode circuit.

With reference to FIG. 17, multi-stage shift decode circuit 51a.n includes a NOR circuit 131. NOR circuit 131 outputs a signal obtained by performing a NOR operation between shift signals F1S(n) and F2S(n) as shift control signal Sn<0>.

Multi-stage shift decode circuit 51a.n further includes AND circuits 132, 134 and 135, an EXOR (Exclusive OR) circuit 133, and an OR circuit 138. AND circuit 132 outputs a signal obtained by performing an AND operation between shift signals F1S(n) and F2S(n). EXOR circuit 133 outputs a signal obtained by performing an EXOR operation between shift signals F1S(n) and F2S(n). AND circuit 134 outputs a signal obtained by performing an AND operation between shift signals F1S(n+1) and F2S(n+1). AND circuit 135 outputs a signal obtained by performing an AND operation between the output signals of EXOR circuit 133 and AND circuit 134. OR circuit 138 outputs a signal obtained by performing an AND operation between the output signals of AND circuits 132 and 135, as shift control signal Sn<2>.

Multi-stage shift decode circuit 51a.n further includes an inverter 136 and an AND circuit 137. Inverter 136 outputs a signal at inverted level from that of AND circuit 134. AND circuit 137 outputs a signal obtained by performing an AND operation between the output signals of EXOR circuit 133 and inverter 136, as shift control signal Sn<1>. Shift control signals Sn<2:0> operate switch circuit 201#.n in data line switching circuit 200.

Next, description will be given of the operation of multi-stage shift decode circuit 51a.n when the fuse program address of fuse group K1 is lower than that of fuse group K2.

Figures 18A, 18B:
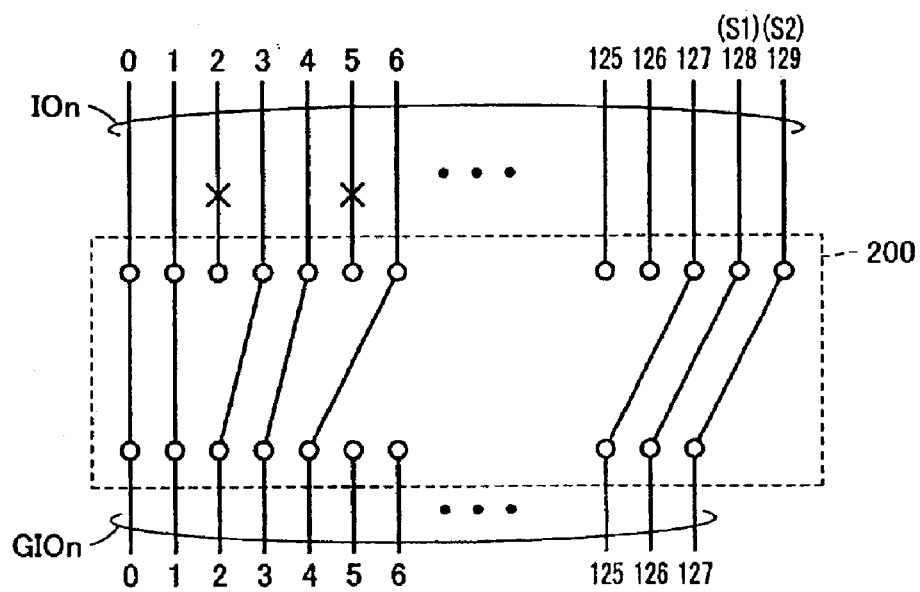
FIGS. 18A and 18B describe the operation of a switching circuit according to the second embodiment.

FIG. 18A shows the state of data line switching circuit 200 when a defective memory cell exists in a plurality of memory cells electrically connected to each of data lines IO2 and IO5 in bank K, for example, during data read and data write. Therefore, "2" is programmed as the defective data line address in fuse group K1. On the other hand, "4" obtained by subtracting "1" from defective data line address "5" is programmed as the defective data line address in fuse group K2.

FIG. 18B differs from FIG. 10B in that the shift count indicates the shift count of switch circuit 201#.n provided in correspondence with each data line GIO. Since the other respects are similar, they will not be repeatedly described herein in detail.

Next, with reference to FIGS. 6, 9, 16, 17, 18A and 18B, the relief operation of data line switching circuit 200 for defective data line IO will be described. Since the operation performed until the defective data line addresses of fuse groups K1 and K2 are decoded by decode circuits 41.n and 41#.n, respectively, is similar to the relief operation for defective data line IO described with reference to FIGS. 10A and 10B, it will not be repeatedly described herein in detail.

As shown in FIG. 6, when the fuse program address of fuse group K1 is "2", shift signals F1S(2) to F1S(127) are set at "1" (H-level) and shift signals F1S(0) to F1S(1) are set at "0" (L-level). Likewise, when the fuse program address of fuse group K2 is "4", shift signals F2S(4) to F2S(127) are set at "1" (H-level) and shift signals F2S(0) to F2S(3) are set at "0" (L-level).

Since shift signals F1S(2) and F1S(3) are both set at H-level and shift signals F2S(2) and F2S(3) are both set at L-level, multi-stage shift decode circuit 51a.2 sets shift control signals S2<0>, S2<1> and S2<2> at L-level, H-level and-L-level, respectively. Shift control signals S2<0>, S2<1> and S2<2> are inputted to switch circuit 201#.2, and data line GIO2 is electrically connected to data line IO3.

On the other hand, since shift signals F1S(4), F1S(5), F2S(4) and F2S(5) are set at H-level, multi-stage shift decode circuit 51a.4 sets shift control signals S4<0>, S4<1> and S4<2> at L-level, L-level and H-level, respectively. Shift control signals S4<0>, S4<1> and S4<2> are inputted to switch circuit 201#.4, and data line GIO4 is electrically connected to data line IO6.

Likewise, other data lines GIO and IO are electrically connected to each other. Finally, as a result of the operation of data line switching circuit 200, defective data line IO turns into an unusable state, making it possible to normally read and write data.

Next, description will be given of the operation of multi-stage shift circuit 51a.n in the case where the fuse program address of fuse group K1 is higher than that of fuse group K2.

Figures 19A, 19B:
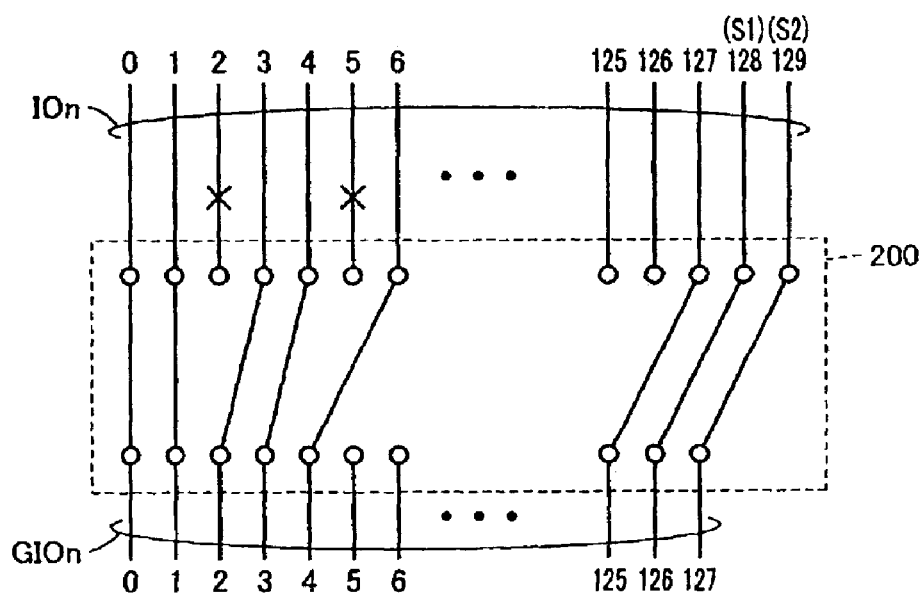
FIGS. 19A and 19B describe the operation of the switching circuit according to the second embodiment.

FIG. 19A shows the state of data line switching circuit 200 when a defective memory cell exists in a plurality of memory cells electrically connected to each of data lines IO2 and IO5 in bank K, for example, during data read and data write. Therefore, "4" obtained by subtracting "1" from defective data line address "5" is programmed as the defective data line address in fuse group K1. On the other hand, "2" is programmed as the defective data line address to fuse group K2.

Since FIG. 19B is similar to FIG. 18B, it will not be repeatedly described herein in detail.

Next, with reference to FIGS. 6, 9, 16, 17, 19A and 19B, description will be given of the relief operation of data line switching circuit 200 for defective data line IO. Since the operation performed until the defective data line addresses of fuse groups K1 and K2 are decoded by decode circuits 41.n and 41#.n, respectively, is similar to the relief operation for defective data line IO described with reference to FIGS. 10A and 10B, it will not be repeatedly described herein in detail.

As shown in FIG. 6, when the fuse program address of fuse group K1 is "4", shift signals F1S(4) to F1S(127) are set at "1" (H-level) and shift signals F1S(0) to F1S(3) are set at "0" (L-level). Likewise, when the fuse program address of fuse group K2 is "2", shift signals F2S(2) to F2S(127) are set at "1" (H-level) and shift signals F2S(0) to F2S(1) are set at "0" (L-level).

Since shift signals F1S(2) and F1S(3) are both set at L-level and shift signals F2S(2) and F2S(3) are both set at H-level, multi-stage shift decode circuit 51a.2 sets shift control signals S2<0>, S2<1> and S2<2> at L-level, H-level and L-level, respectively. Shift control signals S2<0>, S2<1> and S2<2> are inputted to switch circuit 201#.2, and data line GIO2 is electrically connected to data line IO3.

On the other hand, since shift signals F1S(4), F1S(5), F2S(4) and F2S(5) are set at H-level, multi-stage shift decode circuit 51a.4 sets shift control signals S4<0>, S4<1> and S4<2> at L-level, L-level and H-level, respectively. Shift control signals S4<0>, S4<1> and S4<2> are inputted to switch circuit 201#.4, and data line GIO4 is electrically connected to data line IO6.

In multi-stage shift decode circuit 51a.n, in the case where only one of shift signals F1S(n) and F2S(n) respectively decoded by decode circuits 41.n and 41#.n is at H-level, the shift count of switch circuit 201#.n is set at 1. In multi-stage shift decode circuit 51a.n, by contrast, even in the case where only one of shift signals F1S(n) and F2S(n) is at H-level, the shift count of switch circuit 201#.n is set at 2 as long as shift signals F1S(n+1) and F2S(n+1) are both at H-level.

Likewise, other data lines GIO and IO are electrically connected to each other. Finally, as a result of the operation of data line switching circuit 200, defective data line IO turns into an unusable state, making it possible to normally read and write data.

Therefore, even if the fuse program address of fuse group K1 is higher than that of fuse group K2, multi-stage shift decode circuit 51a.n can normally set shift control signals Sn<2:0> similarly to the case where the fuse program address of fuse group K1 is lower than that of fuse group K2. Consequently, if the fuse program addresses are programmed to the two fuse groups, multi-stage shift decode circuit 51a.n can control data line switching circuit 200 irrespectively of the magnitude of the fuse program addresses.

It is noted that multi-stage shift decode circuit 51a.n can be also used in the case where the shift states in data line switching circuit 200 are switched at real time according to the banks in which defective memory cells electrically connected to access target data lines during data read and data write exist. Since the operation of multi-stage shift decode circuit 51a.n is similar to that in semiconductor memory device 1000 in the first embodiment, it will not be described herein in detail.

As described above, the limitation of the magnitude relationship between the defective data line addresses programmed to the two fuse groups is eliminated With this configuration, even if a defective data line address "50" is detected by a shipment test performed to a packaged memory after programming a defective data line address "100" to fuse group K1 in a test in a wafer state, for example, it is possible to program a defective data line address to the other fuse group K2. Therefore, in addition to the advantages which semiconductor memory device 1000 according to the first embodiment exhibits, semiconductor memory device 1000a according to the second can further improve its yield.

Although the present invention has been described and illustrated in detail, it is clearly understood that the same is by way of illustration and example only and is not to be taken by way of limitation, the spirit and scope of the present invention being limited only by the terms of the appended claims.

What is claimed is:
1. A semiconductor memory device comprising:
  a memory cell array having a plurality of memory cells arranged therein, said memory cell array including (L+M) local data lines numbered first to (L+M)th in order in advance, where L is an integer not less than 2 and M is a natural number less than the L, said (L+M) local data lines including:

L normal data lines transmitting input/output data in parallel; and

M spare data lines, each provided to relieve a defect for each normal data line among said L normal data lines, said semiconductor memory device further comprising:

L global data lines for transmitting said input/output data to said memory cell array;

a data line switching circuit provided between said (L+M) local data lines and said L global data lines; and a switching control circuit for controlling said data line switching circuit, said data line switching circuit including L switch circuits provided in correspondence with said L global data lines, respectively, among said L switch circuits, the Jth switch circuit selectively connecting the corresponding Jth global data line to one of the Jth to (J+K)th local data lines among said (L+M) local data lines in accordance with an indicated shift count K, where J is a natural number not more than the L, and K is an integer not less than 0 and not more than M, said switching control circuit including:

M program circuits, each capable of storing a defective address for specifying the normal data line corresponding to said defect among said L normal data lines;

M first decoders provided in correspondence with said M program circuits, respectively; and a second decoder indicating said shift count K to each of said L switch circuits in accordance with M outputs of said M program circuits, each of said M first decoders outputting, in parallel, L determination results as to whether a shift according to each of said L switch circuits can be made when said normal data line corresponding to said defective address stored in the corresponding program circuit is relieved, and said second decoder calculating L of said shift count K, respectively corresponding to said L switch circuits, in accordance with M sets of said L determination results outputted from said M first decoders, respectively.

2. The semiconductor memory device according to claim 1, wherein said memory cell array is divided into N regions to be selective access target, where N is an integer not less than 2, said M program circuits are provided for each of said N regions, and said semiconductor memory device further comprises a switching circuit provided between N sets of said M program circuits and said M first decoders, and transmitting said defective address stored in each of one set of M program circuits corresponding to said access target region among said N sets of M program circuits to corresponding one of said M first decoders.

3. The semiconductor memory device according to claim 1, wherein said shift count K indicated to said Jth switch circuit is equal to the number of the first decoders determined to require said shift among said M first decoders in relation to said Jth switch circuit.

4. The semiconductor memory device according to claim 1, wherein said shift count K indicated to said Jth switch circuit is determined by making a correction to the number of the first decoders, among said M first decoders, determined to require said shift in relation to said Jth switch circuit in accordance with M determination results corresponding to the (J+1)th switch circuit among said L switch circuits out of said M sets of L determination results of said M first decoders.

5. The semiconductor memory device according to claim 1, wherein the M is 2, said second decoder has L decode circuits provided in correspondence with said L switch circuits, respectively, each of said L decode circuits corrects said shift count K of said Jth switch circuit at 2 when said shift count K indicated to said Jth switch circuit is set at 1 and when said shift count K indicated to the (J+1)th switch circuit among said L switch circuits is set at 2.

6. The semiconductor memory device according to claim 1, wherein the M is 2, and the higher defective address among M said defective addresses stored in said M program circuits is set to specify the (I−1)th normal data line when the Ith normal data line among said L normal data lines corresponds to said defect, where I is an natural number not less than 2 and not more than the L.

7. The semiconductor memory device according to claim 1, wherein the M is 2, each of said M first decoders has L first decode circuits, each of M sets of said L first decode circuits output first and second control signals indicating M sets of determination results corresponding to each of said L switch circuits among said M sets of L determination results, respectively, said second decoder has L second decode circuits provided in correspondence with said L switch circuits, respectively, and among said L second decode circuits, the Jth second decode circuit corresponding to said Jth switch circuit has:

a first logic circuit generating a first shift control signal for setting said shift count K indicated to said Jth switch circuit at 0 when levels of said first and second control signals corresponding to said Jth second decode circuit are a predetermined first combination of levels;

a second logic circuit generating a second shift control signal for setting said shift count K indicated to said Jth switch circuit at 1 when the levels of said first and second control signals corresponding to said Jth second decode circuit are a predetermined second combination of levels and also when the levels of said first and second control signals corresponding to the (J+1)th switch circuit among said L switch circuits are a combination of levels other than a predetermined third combination of levels; and a third logic circuit generating a third shift control signal for setting said shift count K indicated to said Jth switch circuit at 2 when the levels of said first and second control signals corresponding to said Jth second decode circuit are said predetermined third combination of levels or when the levels of said first and second control signals corresponding to said Jth second decode circuit are said predetermined second combination of levels and also when the levels of said first and second control signals corresponding to said (J+1)th switch circuit are said predetermined third combination of levels.

* * * * *